United States Patent
Holzapfel et al.

(12) 
(10) Patent No.: US 6,217,410 B1
(45) Date of Patent: Apr. 17, 2001

(54) APPARATUS FOR CLEANING WORKPIECE SURFACES AND MONITORING PROBES DURING WORKPIECE PROCESSING

(75) Inventors: Paul Holzapfel, Tempe; Andrew Yednak, III, Phoenix, both of AZ (US); John Natalicio, Los Angeles, CA (US); Chad Goudie, Chandler, AZ (US)

(73) Assignee: SpeedFam-Ipec Corporation, Chandler, AZ (US)

( * ) Notice: Subject to any disclaimer, the term of this patent is extended or adjusted under 35 U.S.C. 154(b) by 0 days.

(21) Appl. No.: 09/345,047

(22) Filed: Jun. 30, 1999

Related U.S. Application Data (60) Division of application No. 08/895,284, filed on Jul. 16, 1997, now Pat. No. 5,958,148, which is a continuation-in-part of application No. 08/798,803, filed on Feb. 12, 1997, now Pat. No. 5,872,633, which is a continuation-in-part of application No. 08/687,710, filed on Jul. 26, 1996, now abandoned.

(51) Int. Cl.$^7$ .................................................... B24B 51/00

(52) U.S. Cl. ................................... 451/6; 451/8; 451/11; 451/67; 451/288

(58) Field of Search .................................. 134/2, 18, 26, 134/34, 37, 113; 216/38, 52, 60; 451/6, 8, 11, 41, 67, 285, 287, 288, 290; 250/559.27; 356/381, 382; 137/118.01

(56) References Cited

U.S. PATENT DOCUMENTS

| | | |
|---|---|---|
| Re. 34,425 | 11/1993 | Schultz . |
| 4,307,741 | 12/1981 | Rossi . |
| 4,462,860 | 7/1984 | Szmanda . |

(List continued on next page.)

FOREIGN PATENT DOCUMENTS

| | | |
|---|---|---|
| 0 663 265 A1 | 7/1995 | (EP) . |
| 0 718 595 A2 | 6/1996 | (EP) . |
| 0 738 561 A1 | 10/1996 | (EP) . |
| 0 806 266 | 11/1997 | (EP) . |
| WO 96/16436 | 5/1996 | (WO) . |

OTHER PUBLICATIONS

Patent Abstracts of Japan, vol. 097, No. 010, Oct. 31, 1997 & JP 09 159409 (Dainippon Screen Mfg. Co., Ltd.), Jun. 20, 1997—see abstract.

*Primary Examiner*—Timothy V. Eley
(74) *Attorney, Agent, or Firm*—Snell & Wilmer, L.L.P.

(57) ABSTRACT

The present invention provides methods and apparatus which permit the in-process, in-situ, substantially real time measurement of the actual thickness of a surface layer of a workpiece, e.g., a semiconductor wafer. A probe is disposed proximate the outer perimeter of a polishing pad on a CMP table such that the probe establishes optical contact with the wafer surface as a portion of the wafer extends beyond the outer perimeter of the polishing pad. A reflected signal received by the probe is analyzed to calculate the thickness of the surface layer. Alternatively, the reflective characteristics of the semiconductor layers may affect the nature of the reflected signal; changes in the reflected signal can be detected to indicate when a metallic layer has been removed from an oxide layer. In accordance with another aspect of the present invention, a nozzle assembly having a plurality of fluid outlets may be provided to apply a stream of deionized water at the surface under inspection to thereby remove excess slurry and debris from the local region of the workpiece being inspected. A second fluid nozzle may be provided to apply a stream of deionized water to the tip of the probe tip to thereby clean the probe tip between endpoint detection cycles. The nozzle assembly may also include a third fluid nozzle for applying a stream of nitrogen gas to thereby deflect debris away from the probe tip during the endpoint detection procedure and a fourth fluid nozzle for applying a stream of nitrogen gas to thereby remove water and debris from the probe tip during the endpoint detection procedure.

20 Claims, 10 Drawing Sheets

U.S. PATENT DOCUMENTS

| | | |
|---|---|---|
| 4,693,038 | 9/1987 | Vetter . |
| 4,768,713 | 9/1988 | Roper . |
| 4,805,348 | 2/1989 | Arai et al. . |
| 4,989,783 | 2/1991 | Douglas . |
| 5,081,796 | 1/1992 | Schultz . |
| 5,099,614 | 3/1992 | Arai et al. . |
| 5,240,552 | 8/1993 | Yu et al. . |
| 5,329,732 | 7/1994 | Karlsrud et al. . |
| 5,433,649 | 7/1995 | Nishida . |
| 5,433,651 * | 7/1995 | Lustig et al. ............................ 451/6 |
| 5,486,129 | 1/1996 | Sandhu et al. . |
| 5,486,701 | 1/1996 | Norton et al. . |
| 5,498,196 | 3/1996 | Karlsrud et al. . |
| 5,498,199 | 3/1996 | Karlsrud et al. . |
| 5,543,919 | 8/1996 | Munola . |
| 5,555,472 | 9/1996 | Clapis et al. . |
| 5,555,474 | 9/1996 | Ledger . |
| 5,559,428 | 9/1996 | Li et al. . |
| 5,562,529 | 10/1996 | Kishii et al. . |
| 5,568,252 | 10/1996 | Kusada et al. . |
| 5,609,511 | 3/1997 | Moriyama et al. . |
| 5,679,060 * | 10/1997 | Leonard et al. ...................... 451/43 |

* cited by examiner

APPARATUS FOR CLEANING WORKPIECE SURFACES AND MONITORING PROBES DURING WORKPIECE PROCESSING

RELATED APPLICATIONS

This application is a Divisional of U.S. patent application Ser. No. 08/895,284, filed Jul. 16, 1997, issued as U.S. Pat. No. 5,958,148 which is a Continuation-In-Part of U.S. patent application Ser. No. 08/798,803 Feb. 12, 1997, issued as U.S. Pat. No. 5,872,633, which is a Continuation-In-Part of U.S. patent application Ser. No. 08/687,710 Jul. 26, 1996, now abandoned.

TECHNICAL FIELD

The present invention relates, generally, to methods and apparatus for the in-situ endpoint detection of semiconductor layers during a planarization process and, more particularly, to methods and apparatus for the in-process cleaning of semiconductor workpieces and optical measurement probes utilized during endpoint detection processes.

BACKGROUND ART AND TECHNICAL PROBLEMS

The production of integrated circuits begins with the creation of high-quality semiconductor wafers. During the wafer fabrication process, the wafers may undergo multiple masking, etching, and dielectric and conductor deposition processes. Because of the high-precision required in the production of these integrated circuits, an extremely flat surface is generally needed on at least one side of the semiconductor wafer to ensure proper accuracy and performance of the microelectronic structures being created on the wafer surface. As the size of the integrated circuits continues to decrease and the density of microstructures on an integrated circuit increases, the need for precise wafer surfaces becomes more important. Therefore, between each processing step, it is usually necessary to polish or planarize the surface of the wafer to obtain the flattest surface possible.

For a discussion of chemical mechanical planarization (CMP) processes and apparatus, see, for example, Arai, et al., U.S. Pat. No. 4,805,348, issued February, 1989; Arai, et al., U.S. Pat. No. 5,099,614, issued March, 1992; Karlsrud et al., U.S. Pat. No. 5,329,732, issued July, 1994; Karlsrud, U.S. Pat. No. 5,498,196, issued March, 1996; and Karlsrud et al., U.S. Pat. No. 5,498,199, issued March, 1996. One typical CMP procedure involves the removal of one or more semiconductor layers originally present on a wafer. The removal of these layers (often formed of metallic materials such as tungsten, titanium, or the like) eventually exposes the oxide layer of the wafer. The endpoint of such a removal procedure may be indicated by the exposure of the oxide layer, the elimination of the metallic layers, the thickness of the oxide layer, the thickness of the wafer, or other measurable parameters of the wafer.

Methods and systems for performing endpoint detection are disclosed in U.S. patent application Ser. No. 08/798,803, filed Feb. 12, 1997, and entitled Methods and Apparatus for Detecting Removal of Thin Film Layers During Planarization, and U.S. patent application Ser. No. 08/687,710, filed Jul. 26, 1996, and entitled Methods and Apparatus for the In-process Measurement of Thin Film Layers, both of which are hereby incorporated by reference. The systems disclosed in these applications utilize an optical probe device that detects reflective characteristics of the semiconductor wafer surface during planarization. Unfortunately, water, slurries, and other processing materials present on the wafer surface and/or the optical probe may adversely affect the performance of such systems.

Previous attempts at cleaning the workpiece surfaces during such endpoint detection procedures have employed compressed air directed at the point where the optical interrogation signal contacts the workpiece surface. Unfortunately, the compressed air may dry the workpiece surface and/or the slurry, which can cause material build-up and scratching of the polished surface. Furthermore, the compressed air may blow loose particulate onto the surface of the workpiece; such particulate may damage the workpiece or alter the polishing characteristics of the slurry.

SUMMARY OF THE INVENTION

Accordingly, it is an advantage of the present invention that improved methods and apparatus for detecting the endpoint of a planarization procedure performed upon a workpiece are provided.

Another advantage of the present invention is that it provides methods and apparatus for cleaning a workpiece surface and for cleaning an optical endpoint detection probe during a planarization procedure performed upon the workpiece.

A further advantage is that the present invention employs water to clean a semiconductor wafer surface to provide a suitable area for optical interrogation during an endpoint detection process.

Another advantage of the present invention is that the present invention employs compressed gas to clean an optical endpoint detection probe to facilitate substantially consistent signal generation and detection during an endpoint detection process.

A further advantage is that the present invention provides a system that employs water and compressed gas to respectively clean a workpiece and an optical endpoint detection probe in a controlled manner in accordance with the operating protocol of a corresponding endpoint detection process.

The above and other advantages of the present invention may be carried out in one form by an apparatus for cleaning a surface of a workpiece during processing of the workpiece. The apparatus includes a support block having first and second fluid paths formed therein, a cavity for coupling an interrogation probe to the support block, a first fluid outlet for directing a first fluid proximate the tip of the probe during processing of the workpiece, and a second fluid outlet for applying a second fluid to the surface of the workpiece during a workpiece monitoring procedure. The probe is utilized to interrogate the surface of the workpiece during the monitoring procedure.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EXEMPLARY EMBODIMENTS

The subject invention relates to a fixture for cleaning the surface of a workpiece during the in-process detection of characteristics of a layer of the workpiece using a light source and a controller for processing information associated with light signals reflected from the workpiece surface. The preferred embodiment set forth herein may also be configured to clean an interrogation probe that produces the light signal such that processing materials and debris do not adversely affect the measurement of the surface characteristics, e.g., the detection of oxide layer thickness on a semiconductor wafer (either patterned or non-patterned), end point detection, the detection of surface irregularities, planarity, and the like.

Figure 1:
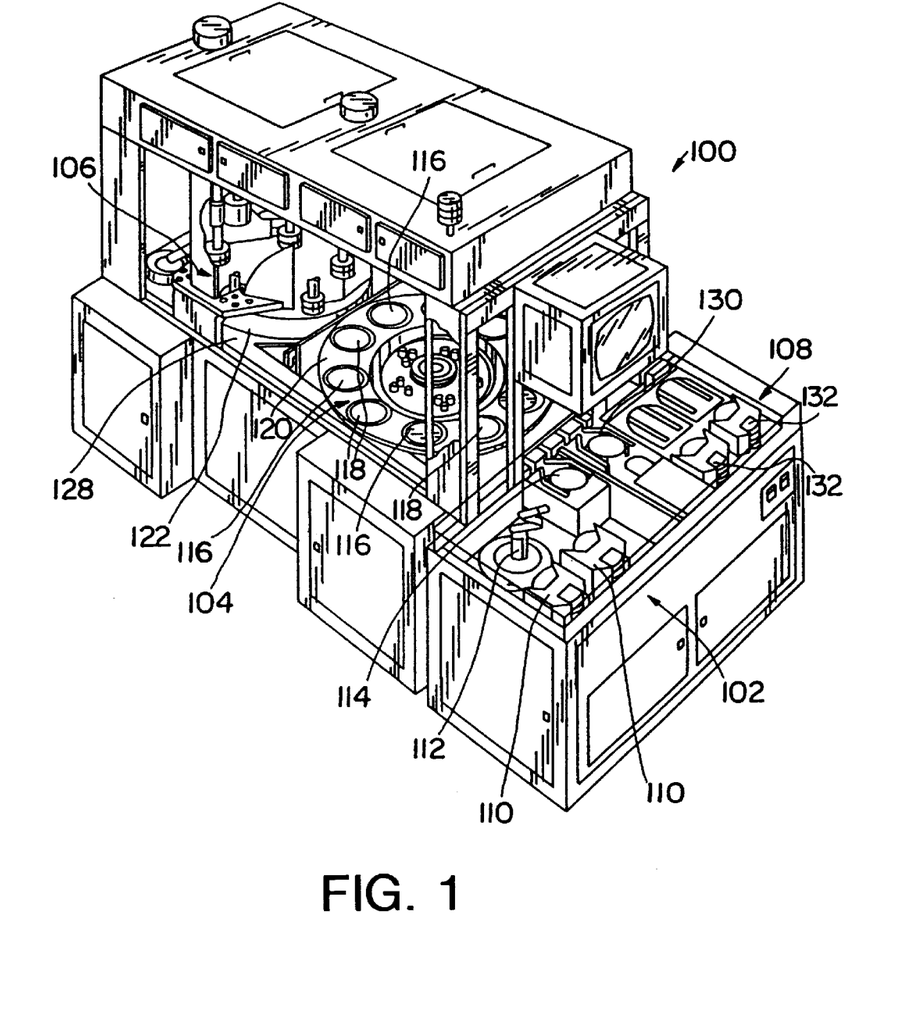
FIG. 1 is a perspective view of an exemplary CMP machine upon which a probe assembly in accordance with the present invention may be suitably installed.
Figure 2:
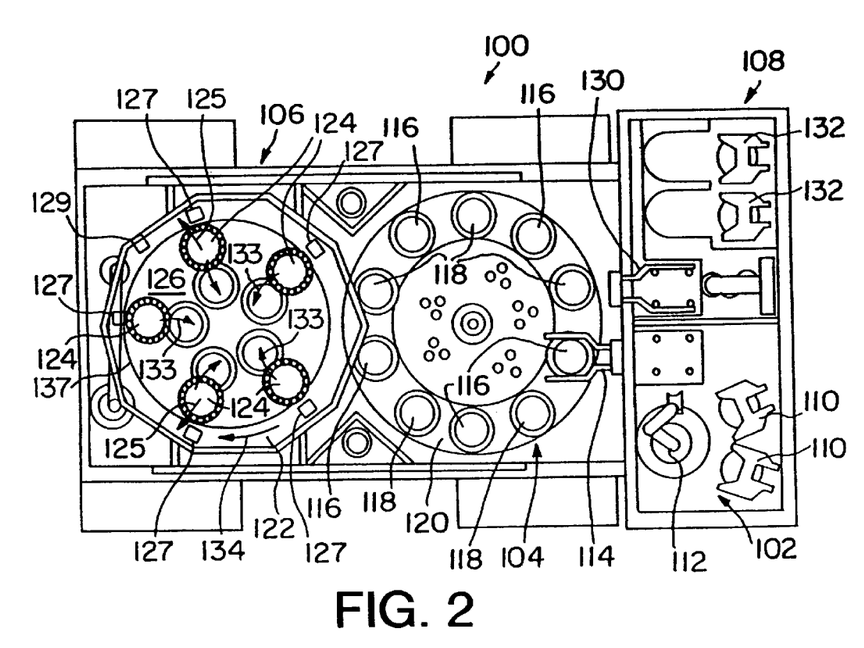
FIG. 2 is a top view of the CMP machine of FIG. 1, showing an exemplary orientation of the probe assemblies of the present invention.

Referring now to FIGS. 1–2, a wafer polishing apparatus 100 is shown embodying the present invention. Wafer polishing apparatus 100 suitably comprises a multiple head wafer polishing machine which accepts wafers from a previous processing step, polishes and rinses the wafers, and reloads the wafers back into wafer cassettes for subsequent processing.

Discussing now the polishing apparatus 100 in more detail, apparatus 100 comprises a load station 102, a wafer transition station 104, a polishing station 106, and a wafer rinse and unload station 108.

In accordance with a preferred embodiment of the invention, cassettes 110, each holding a plurality of wafers, are loaded into the machine at load station 102. Next, a robotic wafer carrier arm 112 removes the wafers from cassettes 110 and places them, one at a time, on a first wafer transfer arm 114. Wafer transfer arm 114 then sequentially lifts and moves each wafer into wafer transition section 104. That is, transfer arm 114 suitably places an individual wafer on one of a plurality of wafer pick-up stations 116 which reside on a rotatable table 120 within wafer transition section 104. Rotatable table 120 also suitably includes a plurality of wafer drop-off stations 118 which alternate with pick-up stations 116. After a wafer is deposited on one of the plurality of pick-up stations 116, table 120 rotates so that a new station 116 aligns with transfer arm 114. Transfer arm 114 then places the next wafer on the new empty pick-up station 116. This process continues until all pick-up stations 116 are filled with wafers. In the illustrated embodiment of the invention, table 120 includes five pick-up stations 116 and five drop-off stations 118.

Next, a wafer carrier apparatus 122, comprising individual wafer carrier elements 124, suitably aligns itself over table 120 so that respective carrier elements 124 are positioned directly above the wafers which reside in respective pick-up stations 116. The carrier apparatus 122 then drops down and picks up the wafers from their respective stations and moves the wafers laterally such that the wafers are positioned above polishing station 106. Once above polishing station 106, carrier apparatus 122 suitably lowers the wafers, which are held by individual elements 124, into operative engagement with a polishing pad 126 which sits atop a lap wheel 128. During operation, lap wheel 128 causes polishing pad 126 to rotate about its vertical axis. At the same time, individual carrier elements 124 spin the wafers about their respective vertical axes and oscillate the wafers back and forth across pad 126 (substantially along arrow 133) as they press against the polishing pad. In this manner, the undersurface of the wafer is polished or planarized.

After an appropriate period of time, the wafers are removed from polishing pad 126, and carrier apparatus 122 transports the wafers back to transition station 104. Carrier apparatus 122 then lowers individual carrier elements 124 and deposits the wafers onto drop-off stations 118. The wafers are then removed from drop-off stations 118 by a second transfer arm 130. Transfer arm 130 suitably lifts each wafer out of transition station 104 and transfers them into wafer rinse and unload station 108. In the unload station 108, transfer arm 130 holds the wafers while they are rinsed. After a thorough rinsing, the wafers are reloaded into cassettes 132, which then transports the subsequent stations for further processing or packaging.

Although CMP machine 100 is shown having five polishing stations, it will be appreciated that the present invention may be employed in the context of virtually any number of polishing stations. Moreover, the present invention may also be employed in circumstances where not all of the polishing stations are functioning at a time. For example, many standard wafer cassettes are capable of carrying up to twenty-five individual workpieces in a single cassette. Consequently, because there are often five workpiece chucks on a single CMP machine, often times the last four disks within a cassette are polished at one time, leaving the fifth disk-holder empty.

With continued reference to FIG. 2, a probe assembly 127 is suitably configured near the outer perimeter edge of polishing pad 126 proximate each carrier element 124. More particularly, in a preferred embodiment of the present invention, each respective carrier element suitably oscillates back and forth along arrow 133; each carrier element 124 also suitably rotates a workpiece about the vertical axis of carrier element 124. At the same time, lap wheel 128 and pad 126 are advantageously configured to rotate about their vertical axis, for example, in a counter clockwise direction as indicated by arrow 134.

In accordance with a particularly preferred embodiment, each carrier element 124 is suitably configured to periodically extend radially outward from the center of table 126 along arrow 125 such that at least a portion of the outside radius of each workpiece extends beyond the outer edge 137 of table 126. By crossing the outer edge of polishing table 126, information relating to surface material thicknesses, desirable material removal rates, and the extent of layer removal may be obtained for the workpieces. As a workpiece extends beyond the outer perimeter of the polishing pad, along arrow 125, the bottom facing surface of the workpiece may be conveniently optically engaged by probe assembly 127, as described in greater detail below in conjunction with FIG. 3.

In accordance with a further aspect of the present invention, apparatus 100 may be configured with a probe assembly 129 useful for detecting the presence of a wafer or wafer fragment on polishing pad 126 during the polishing process. In accordance with this aspect of the invention, if a wafer or wafer fragment is detected on the pad at a time and/or position indicating an anomaly, the CMP machine 100 may be configured to shut down. A detailed discussion of the operation of probe assembly 129 is discussed in detail in U.S. patent application Ser. No. 08/683,150, filed on Jul. 17, 1996, and entitled Methods and Apparatus for the In-Process Detection of Workpieces in a CMP Environment.

Figure 3:
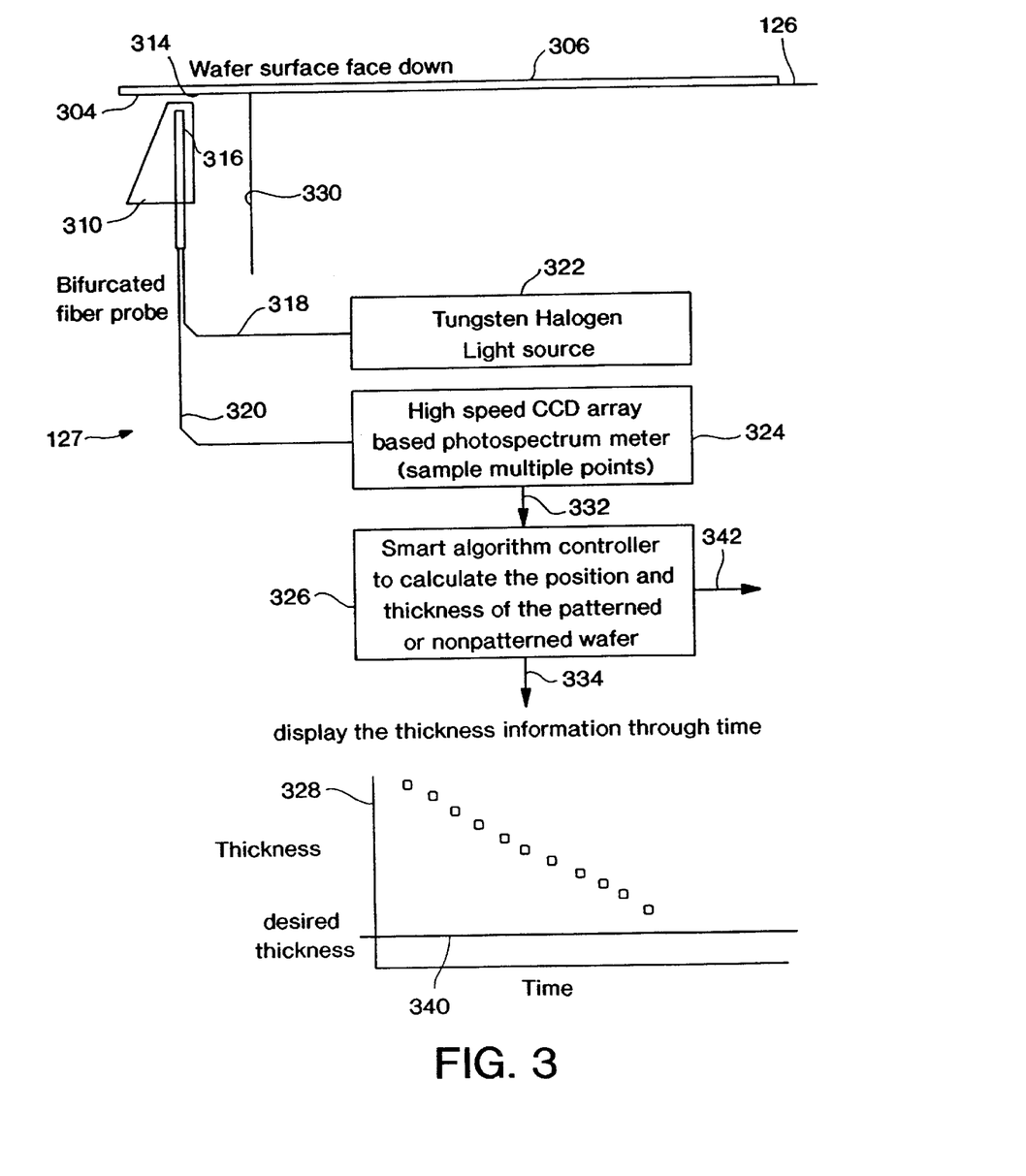
FIG. 3 is a schematic view of a probe in accordance with the present invention configured to sample the surface of a wafer, including a light source, a photospectrum meter, a controller, and a display.

Referring now to FIG. 3, an exemplary embodiment of probe assembly 127 in accordance with the present invention suitably comprises a bifurcated fiber probe 316, a fixture 310 having a plurality of fluid outlets (not shown in FIG. 3) through which fluids may be suitably directed at the undersurface of a workpiece 306 (e.g., a semiconductor wafer disk) or at probe 316, a light source 322, a photospectrum analyzer 324, a controller/processor 326, and a display 328.

FIG. 3 depicts an exemplary workpiece 306 being polished by polishing pad 126 as described above in conjunction with FIGS. 1 and 2. For clarity, carrier element 124 and other components are omitted from FIG. 3. Fixture 310 is suitably mounted proximate the outer perimeter 330 of pad 126, such that cleaning fluid may be directed at a bottom surface 304 of workpiece 306 when at least a portion of the workpiece extends off the perimeter edge of polishing pad 126.

In an exemplary embodiment, probe 316 suitably outputs a broad band (e.g., white light) interrogation signal toward a region 314 on undersurface 304; a portion of the light emitted by probe 316 is reflected or scattered back from region 314 and captured by probe 316. As described in more detail below, fixture 310 is preferably configured to apply a cleaning fluid to surface 304 to facilitate the removal of slurry from region 314. Probe 316 suitably includes a transmitter cable 318 through which light is transmitted from light source 322 to probe 316 and onto the undersurface 304 of workpiece 306. Similarly, probe 316 preferably includes a receptor cable 320 which receives reflected light from probe 316 and transmits it to photospectrum meter 324. It will be appreciated that the undersurface of the workpiece may be sampled by probe assembly 127 at any desired rate or the sampling may be substantially continuous.

It should be appreciated that light source 322 may be suitably configured to generate and transmit any desired light signal (e.g. broadband, narrowband, or substantially monochromatic) to the surface 304 of workpiece 306. For example, any suitable source (e.g. a tungsten halogen light source) capable of emitting a broad band light signal, for example in the range of 350 to 2000 nanometers, and most preferably in the range of 400 to 850 nanometers, is acceptable. In accordance with the present invention, a suitable halogen light source may comprise a model number L73A98, available from the Gilway Corporation of Massachusetts.

Although cables 318 and 320 suitably comprise fiber optic cables in the preferred embodiment, virtually any conductor may be employed which satisfactorily delivers an appropriate interrogation signal (e.g., a lightsignal) to workpiece 306 and captures at least a portion of the signal reflected by the workpiece 306. Moreover, although the preferred embodiment set forth herein employs a light signal, virtually any convenient modality may be employed to interrogate the surface of the workpiece, e.g., an acoustic signal, magnetic signal, or the like.

Photospectrum meter 324 suitably includes any circuit capable of interpreting the signal reflected from undersurface 304 of workpiece 306. In a preferred embodiment, photospectrum meter 324 suitably comprises a PCMCIA-based photospectrum meter model number PS1000 available from the Mission Peak Optics Company of Fremont, Calif. Alternatively, photospect meter 324 may be configured as a PC plug-in device, such as model number PC1000 (also available from the Mission Peak Optics Company).

Controller 326 may be realized by any general purpose controller capable of receiving an output signal 332 from meter 324 and calculating various parameters from output signal 332. In the preferred embodiment, controller 326 is suitably configured to interpret output signal 332 and thereby derive the thickness of the oxide layer present in region 314 of workpiece 306. In a particularly preferred embodiment, controller 326 may be implemented in a general purpose personal computer and be responsive to application-specific software instructions. Controller 326 is also suitably configured to output a signal 334 to display terminal 328. In a preferred embodiment, signal 334 is indicative of the thickness of the oxide layer at region 314; it will be understood, however, that signal 334 may embody any suitable information or characteristic associated with surface 304 or region 314 of workpiece 306, such that any number of parameters may be conveniently displayed on the screen associated with display module 328. For example, signal 334 may convey information indicative of the removal of a first semiconductor layer from a second semiconductor layer (described below). In the embodiment illustrated in FIG. 3, a graph of oxide layer thickness versus time is shown.

With continued reference to FIG. 3, display terminal 328 may be suitably configured to display information pertaining to undersurface 304 of workpiece 306 (e.g., the thickness of the oxide layer or the material composition of the exposed layer) in any desired format. In the thickness versus time graph shown in FIG. 3, the remaining processing time necessary to arrive at a desired thickness 340 may be visually assessed by the operator; alternatively, controller 326 may be configured to "predict" the time necessary to arrive at a desired thickness for a given pressure and also to display the remaining time to the operator. Alternatively, the controller may be configured to transmit a second output signal 342 to the main controller of machine 100, for example to vary the pressure or other operating parameter(s) associated with the particular carrier element 124 corresponding to the workpiece under inspection. For example, if it is desired that all workpieces complete their processing at approximately the same time, and wherein one or more of the workpieces are closer to the desired thickness than other workpieces, it may be advantageous to reduce the pressure for those workpieces where less material remains to be removed and/or to increase the pressure for those workpieces where a relatively larger amount of material remains to be removed.

In this regard, the present inventors have determined that typical desired material removal rates of oxide layers on semiconductor wafers generally range from 1,000–5,000 angstroms per minute, and preferably about 2,500 angstroms per minute. By calculating the differences in thickness over different sampling periods, controller 326 may also be suitably configured to generate a real time or average material removal rate. In accordance with a preferred embodiment, controller 326 may suitably be configured to output signal 342 to increase or decrease the removal rate, as desired.

With continued reference to FIG. 3, fixture 310 may be mounted to machine 100 in any convenient way, for example, by attaching it to the frame associated with machine 100 by any suitable fastening mechanism. Indeed, it may be possible to dispose respective fixtures 310 such that respective probes 316 are located proximate the surfaces 304 of workpieces 306 during interrogation by probes 316, for example in the range of 0.1 to 0.5 inches and most preferably about 0.3 inches from the workpieces 306. Even though this environment may be sprayed by slurry droplets and water from time to time, fixture 310 preferably includes a number of fluid outlets (described below) that eject cleaning fluids that substantially prevent slurry from corrupting the operation of probe 316. One preferred embodiment of an exemplary fixture 310 is described in more detail below in conjunction with FIGS. 9–19.

In accordance with a particularly preferred embodiment, probe assembly 127 may be suitably configured to direct output signal 342 to machine 100 to thereby terminate the processing of a particular workpiece 306 when it is determined that desired thickness 340 has been reached. In this way, although it still may be desirable to verify the thickness of the oxide layer once the workpieces 306 have been removed, a very high degree of accuracy in the actual thickness of the oxide layer is obtained. In accordance with this aspect of the present invention, the need to place partially completed wafers back onto machine 100 for further material removal is substantially eliminated. Similarly, the risk of removing too much of the oxide layer, thus degrading the wafers, is also greatly reduced. In this respect, the present invention may be alternatively configured to indicate when the oxide layer is initially exposed (described below).

Figure 4:
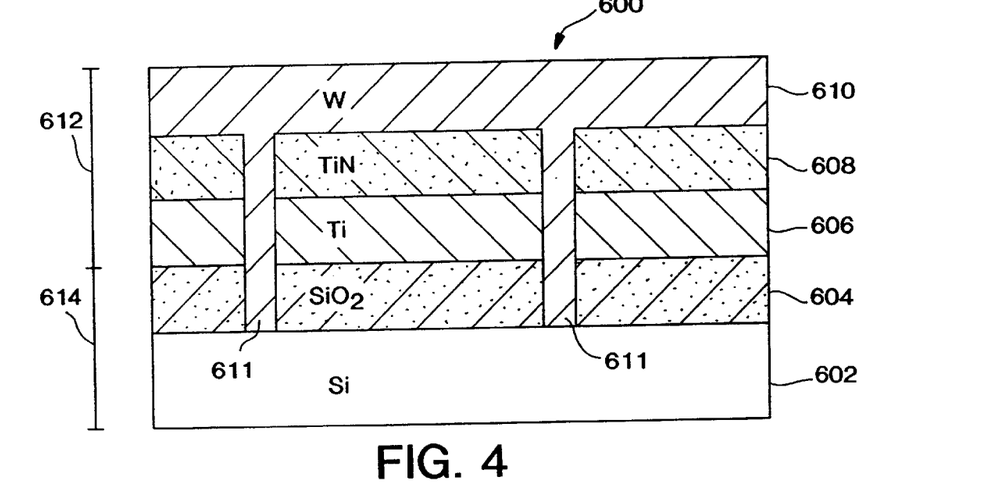
FIG. 4 is a cross sectional depiction of an exemplary semiconductor wafer.

As mentioned above, the present invention may also be employed to detect when a first material layer, e.g, a tungsten or titanium layer, has been removed from a second material layer, e.g., an oxide layer. It should be noted that the present invention may be suitably adapted to detect semiconductor, conductor, or other layers that may be present on a semiconductor wafer. Semiconductor layers are described herein for illustrative purposes only, and the present invention is not limited to the detection of such layers. FIG. 4 is a cross sectional representation of an exemplary semiconductor wafer 600. Of course, the dimensions of wafer 600 are exaggerated for illustrative purposes. Wafer 600 may include a silicon substrate base 602, an oxide (silicon dioxide) layer 604, a titanium layer 606, a titanium nitride layer 608, and a tungsten layer 610. In accordance with conventional semiconductor fabrication techniques, a number of plugs 611 may be formed within wafer 600.

During planarization, the metallic upper layers, e.g., tungsten layer 610, titanium nitride layer 608, and titanium layer 606, are removed from wafer 600, while some material is maintained within the associated plugs 611. Preferably, material removal terminates (or slows down) when oxide layer 604 is exposed. As described above, the present invention may be employed to measure the thickness of oxide layer 604 to optimize the planarization process. Those skilled in the art will appreciate that the specific layering configuration and the composition of the various layers may vary from wafer to wafer depending on the device being created.

For purposes of the following description, a first region 612 of wafer 600 may be defined as that portion of wafer 600 above oxide layer 604. A second region 614 may be defined as that portion of wafer 600 that includes oxide layer 604, silicon base 602, and any other layers (not shown) that may be formed below oxide layer 604. It should be appreciated that although the transition from titanium layer 606 to oxide layer 604 is described herein, the present invention may be suitably adapted to detect the transition from any two material layers having distinguishable optical reflective characteristics. Such adaptation may require additional or alternative processing and/or the application of different detection algorithms than those described above.

Figure 5:
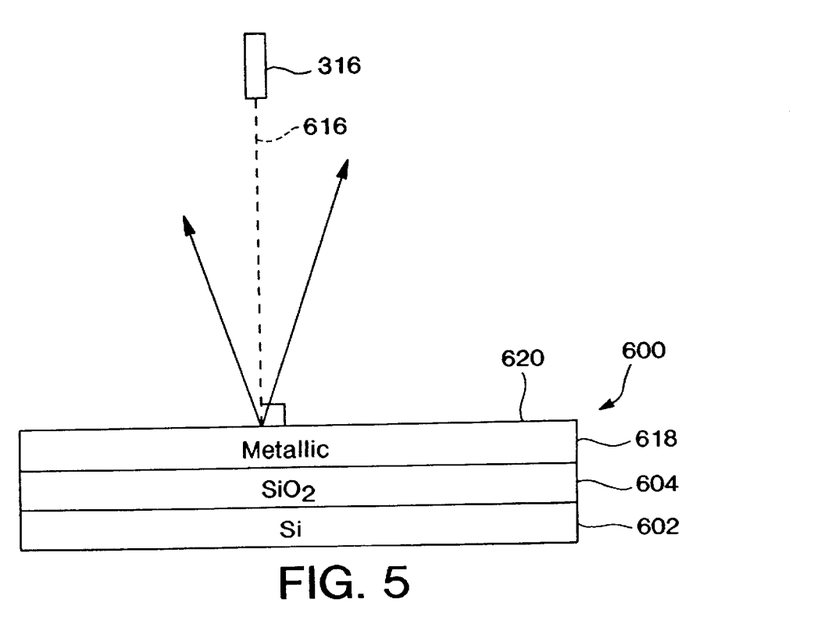
FIG. 5 is a schematic view of a probe sampling a metallic layer of the semiconductor wafer shown in FIG. 4.

The metallic layer endpoint detection feature takes advantage of the distinguishable reflective characteristics of the various semiconductor layers within wafer 600. FIG. 5 shows probe 316 (see FIG. 3) directing an input interrogation signal 616 at wafer 600. Input signal 616 may be directed toward wafer 600 at an angle of approximately 80 to 100 degrees, and preferably at an angle of approximately 90 degrees, relative to the upper surface 620 of wafer 600. The "metallic" layer 618 shown in FIG. 5 is intended to generically indicate any semiconductor material of a metallic composition, e.g., tungsten, copper, titanium, titanium nitride, or the like. The metallic nature of layer 618 causes input signal 616 to reflect from layer 618.

Figure 6:
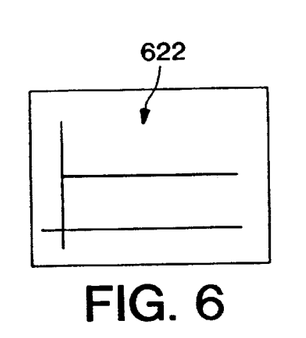
FIG. 6 shows an exemplary output signal generated in response to the sampling of the metallic layer depicted in FIG. 5.

FIG. 6 depicts an exemplary output 622 that may be generated in response to the continued presence of metallic layer 618 and displayed on display terminal 328 (see FIG. 3 and accompanying discussion). A flat output (or any other predetermined display or indicator) may indicate that the reflected signal detected at probe 316 is less than a predetermined threshold value. Alternatively, the same output may indicate that the reflected signal detected at probe 316 has certain detectable characteristics that are distinguishable from a signal reflected from oxide layer 604. For example, the reflected signal itself may have monotonic characteristics when reflected from metallic layer 618 and sinusoidal characteristics when reflected from oxide layer 604 (or a nonmetallic layer).

In accordance with a further aspect of the present embodiment of the invention, in addition to generating such a display, wafer polishing apparatus 100 may be instructed, by suitable processing and control elements, to continue with the planarization procedure, i.e., to continue removing additional layers or more material from the present layer.

Figure 7:
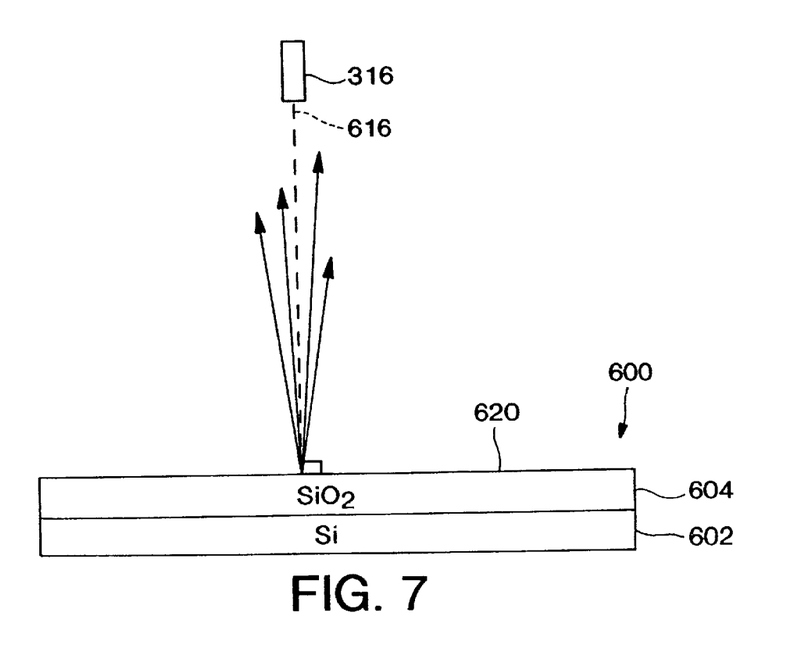
FIG. 7 is a schematic view of a probe sampling an oxide layer of the semiconductor wafer shown in FIG. 4.
Figure 8:
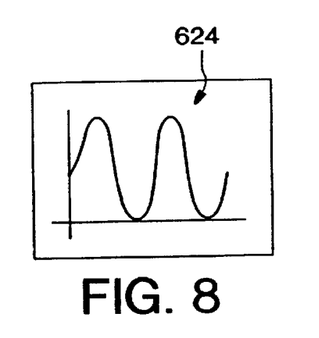
FIG. 8 shows an exemplary output signal generated in response to the sampling of the oxide layer depicted in FIG. 7.
Figure 9:
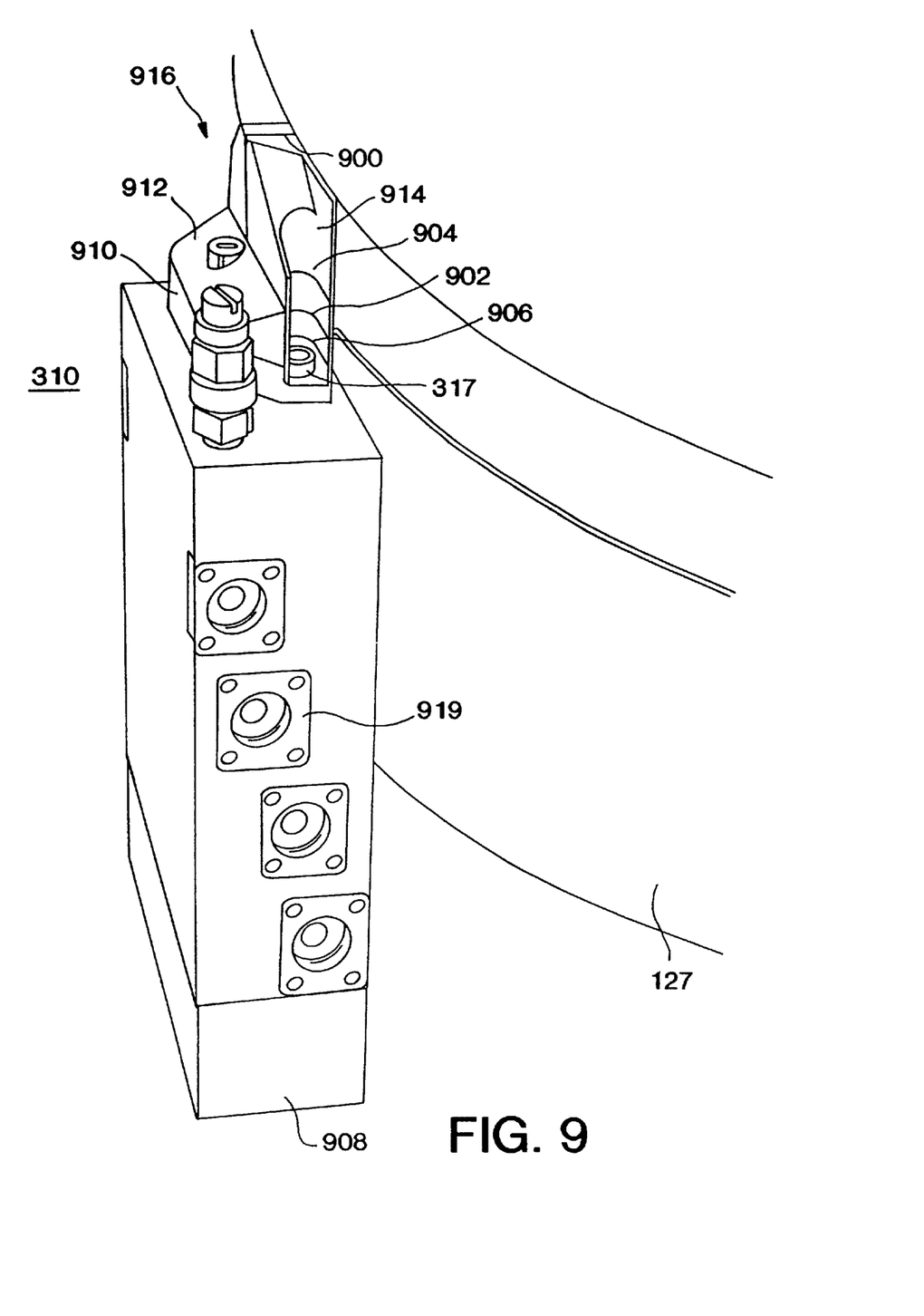
FIG. 9 is a perspective view of a probe and workpiece cleaning fixture in accordance with the present invention.
Figure 10:
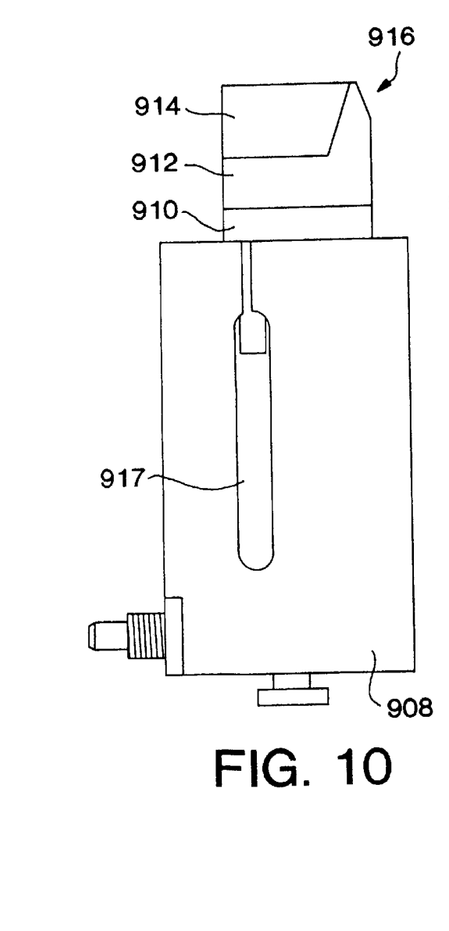
FIGS. 10–14 are various views of the fixture shown in FIG. 9.
Figure 11:
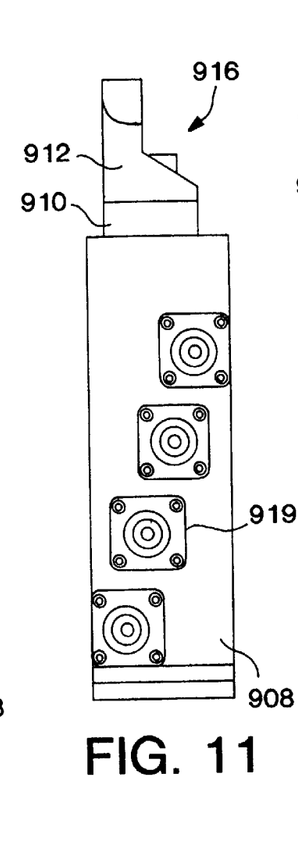

FIG. 7 shows probe 316 directing input signal 616 at wafer 600 after the planarization process has exposed oxide layer 604. As shown, the metallic layer 618 has been removed from wafer 600. Although not shown in FIG. 7, various plugs 611 formed from tungsten may remain embedded in oxide layer 604 (see, for example, FIG. 4). FIG. 8 depicts an exemplary output 624 that may be displayed on display terminal 328 after oxide layer 604 has become exposed. A sinusoidal output (or any other predetermined display or indicator) may indicate that the reflected signal detected at probe 316 is greater than the predetermined threshold value. Alternatively, the same output may indicate that the reflected signal detected at probe 316 has certain detectable characteristics that are distinguishable from a signal reflected from metallic layer 618. For example, the reflected signal may become sinusoidal in nature after the metallic layer 618 has been cleared away and oxide layer 604 becomes the reflective surface. In addition, suitable control processes may cause wafer polishing apparatus 100 to halt the planarization procedure or slow the procedure down such that subsequent removal of material may be closely monitored.

It should be appreciated that the detection of oxide layer 604 in this manner is substantially independent of the amount and type of slurry and other consumables that may be present in the CMP environment. Unlike conventional endpoint detection techniques that depend on mechanical characteristics such as polishing pad friction and motor currents, this technique can effectively detect the removal of a metallic layer without relying upon physical interaction with the system. Those skilled in the art will appreciate that the present invention may be utilized to detect the transition between any two reflectively distinguishable materials during a removal or planarization process. For example, if required, the processing and display functions of the present invention may be appropriately modified to detect the removal of an oxide layer from a metallic layer, or one metallic layer from another metallic layer.

Referring now to FIGS. 9–19, fixture 310 is illustrated in detail. Fixture 310 is suitably configured to hold and orient probe 316 in a substantially perpendicular position relative to bottom surface 304. In the preferred embodiment depicted in FIGS. 9–19, fixture 310 includes a plurality of fluid outlets, e.g., a workpiece rinse outlet 900, a probe rinse outlet 902, a debris deflector outlet 904, and a probe drying outlet 906. It should be appreciated that the specific type of fluid dispensed by outlets 900, 902, 904, and 906 may vary from application to application and that "fluid" in the context of this specification means any suitable gas, liquid, or solid substance capable of flowing through outlets 900, 902, 904, and 906. For example, the preferred embodiment employs deionized water as the cleansing liquid dispensed by outlets 900 and 902 and compressed nitrogen as the gas dispensed by outlets 904 and 906. In the preferred embodiment, the water is utilized to remove slurry, debris, and the like from undersurface 304 of workpiece 306 and from the tip 317 of probe 316, while the nitrogen gas is utilized to remove the cleansing liquid from the tip 317 of probe 316 and to prevent debris and water from dripping onto probe 316.

Figure 16:
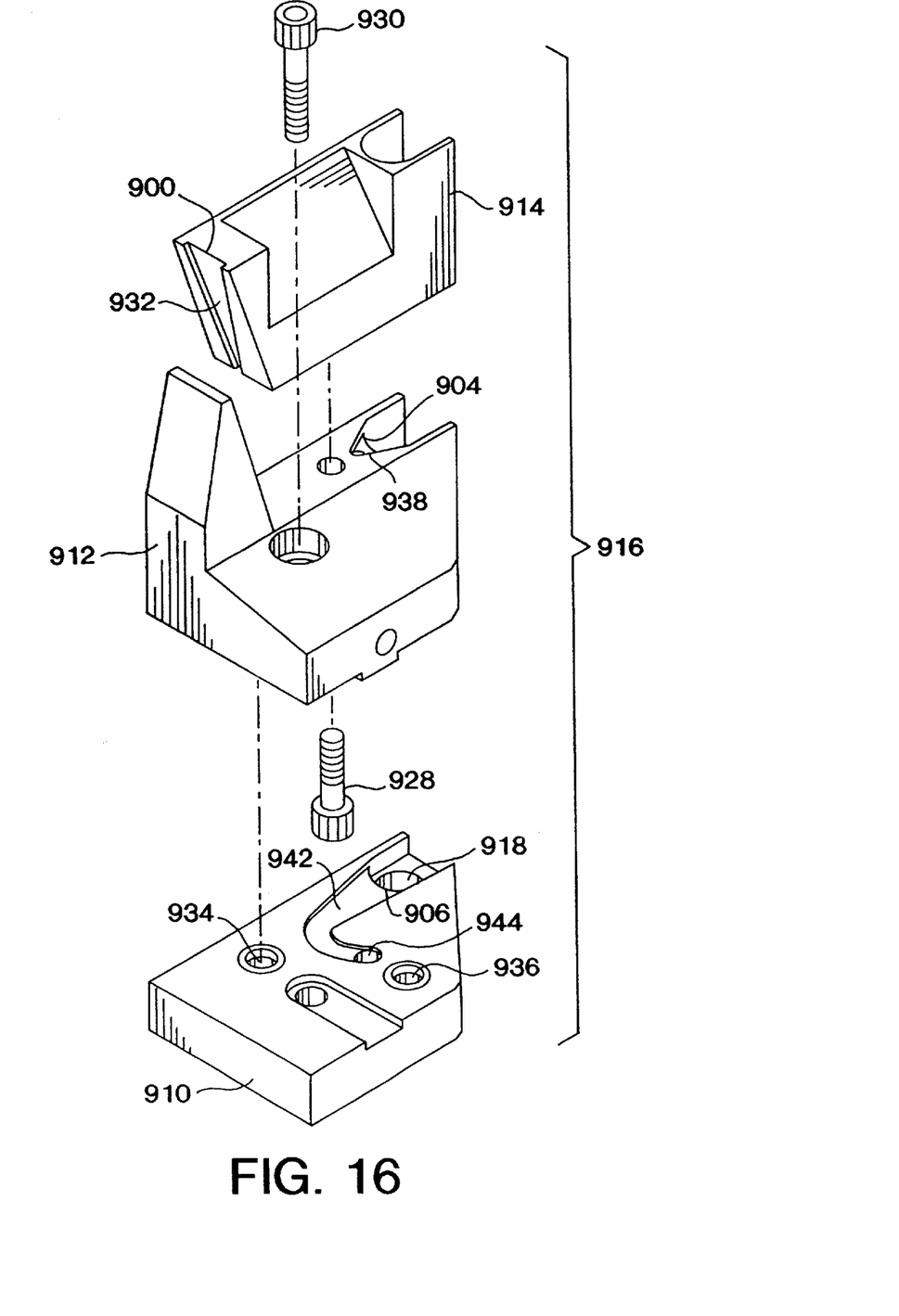
FIG. 16 is an exploded perspective view of the nozzle assembly.

Fixture 310 generally includes a support block 908, a lower block assembly 910, an intermediate block assembly 912, and an upper block assembly 914. Lower block assembly 910, intermediate block assembly 912, and upper block assembly 914 preferably combine to form a nozzle assembly 916 within which outlets 900, 902, 904, and 906 are formed. In one exemplary embodiment, lower block assembly 910 is coupled to intermediate block assembly 912, which is coupled to upper block assembly 914. As best shown in FIG. 16, a fastener 928 may be used to attach intermediate block assembly 912 to upper block assembly 914 and a fastener 930 may be used to attach intermediate block assembly 912 to lower block assembly 910. Support block 908 and block assemblies 910, 912, and 914 may be molded or machined from a substantially corrosion resistant material such as acetal, which is commercially sold under the trade name DELRIN.

Figure 13:
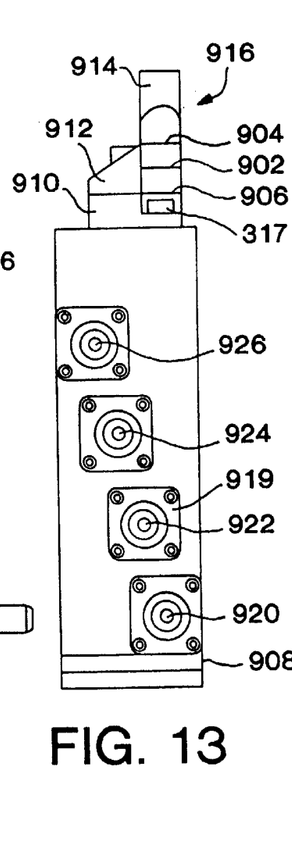
Figure 14:
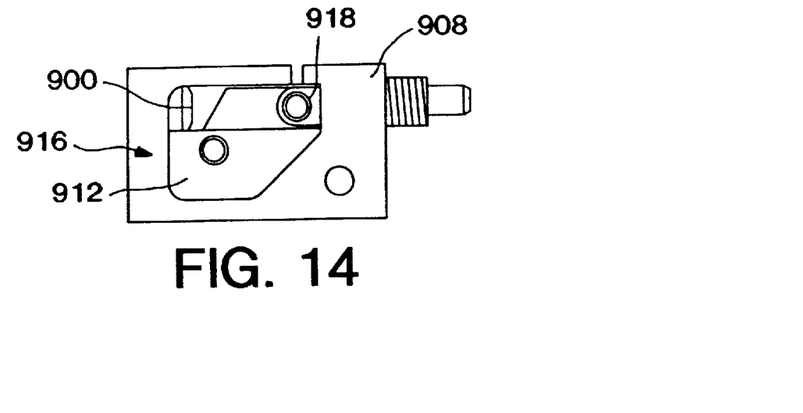
Figure 15:
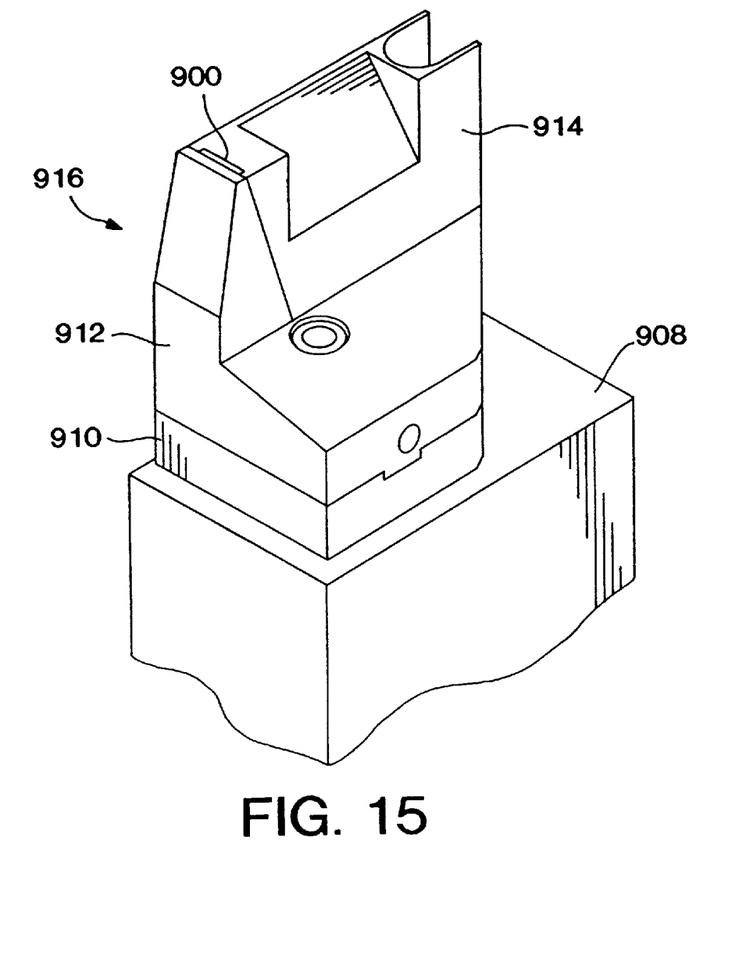
FIG. 15 is a perspective view of an exemplary nozzle assembly that may be employed by the fixture.

Support block 908 preferably includes a cavity, 917 formed therein for coupling an interrogation probe, e.g., probe 316, to support block 908 and for orienting probe 316 in a desirable position relative to workpiece 306. Fixture 310 may alternatively employ any suitable coupling mechanism or structure to mount probe 316 proximate support block 908. As shown best in FIGS. 9 and 13, probe 316 preferably terminates at probe tip 317. Probe tip 317 may be covered by a lens or other suitable element capable of transmitting interrogation and reflected signals while protecting probe 316 from materials present in the processing environment. As depicted in FIG. 16, nozzle assembly 916 (in particular lower block 910) may include an aperture 918 formed therein. Aperture 918 is suitably configured to receive probe tip 317 and to orient probe tip 317 according to the desired transmit axis. Of course, the present invention may employ any suitable device or structure for receiving probe tip 317 within nozzle assembly 916.

As described above, the interrogation signal is configured to interrogate surface 304 during a workpiece monitoring procedure, e.g., an endpoint detection procedure or a workpiece thickness measurement. As shown in FIG. 3, probe 316 is preferably positioned within fixture 310 such that the interrogation signal is transmitted along a substantially orthogonal axis relative to surface 304. It should be appreciated that probe 316 may be alternately configured to transmit the interrogation signal at any angle relative to surface 304; in a preferred embodiment, the transmit axis forms an angle between 45 and 90 degrees relative to surface 304.

Figure 12:
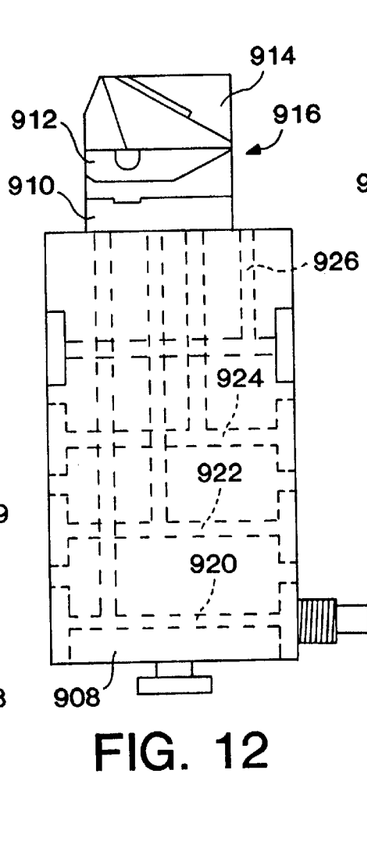

Support block 908 includes a number of fluid paths formed therein for delivering fluids to probe tip 317 and to surface 304 of workpiece 306 via nozzle assembly 916. A number of fittings 919 may be employed to couple appropriate hoses or conduits (not shown) to support block 908. In the preferred embodiment, and as shown in phantom in FIG. 12, support block may include a fluid path 920 corresponding to probe rinse outlet 900, a fluid path 922 corresponding to workpiece rinse outlet 902, and a fluid path 924 corresponding to debris deflector and probe drying outlets 904 and 906. An additional fluid path 926 may also be employed to provide a cleansing agent, such as deionized water, to workpiece 306 for purposes of additional rinsing independent of the workpiece monitoring procedure. The various paths formed within support block 908 are preferably distinct from one another; the paths may be constructed by drilling or boring support block 908 in predetermined horizontal and vertical locations. In the preferred embodiment, fluid path 924 communicates with a common conduit (described below) for both debris deflector and probe drying outlets 904 and 906. Thus, the delivery of nitrogen gas (or other suitable fluid) through outlets 904 and 906 may originate from a single source and be jointly controlled by a single regulator.

Workpiece rinse outlet 900 is located and configured to apply deionized water from a first source (not shown) to surface 304 during the workpiece monitoring procedure to thereby clean region 314 in preparation for interrogation by probe 316. Deionized water is a desirable cleansing fluid in CMP applications because commercially available slurries are constituted from a deionized water base and rinsing with deionized water will not alter the chemical composition or functional characteristics of the slurries. In addition, the use of deionized water ensures that no harmful chemicals or minerals are introduced during treatment of workpiece 306. Of course, those skilled in the art will recognize that workpiece rinse outlet 900 (and outlets 902, 904, and 906) may be suitably sized and shaped to emit a stream or spray of any appropriate rinse, cleaning, or other fluid in accordance with the specific application.

In the preferred embodiment, workpiece rinse outlet 900 is formed between intermediate block assembly 912 and upper block assembly 914 (see FIG. 16). In an exemplary embodiment, workpiece rinse outlet 900 is configured as a channel 932 formed within upper block assembly 914. The shape and size of channel 932 may vary according to the specific application or to provide the desired amount of fluid to the workpiece. Alternatively, the present invention may utilize a separate fluid jet or nozzle element coupled to nozzle assembly 916 rather than an integrally formed workpiece rinse outlet 900.

Figure 17:
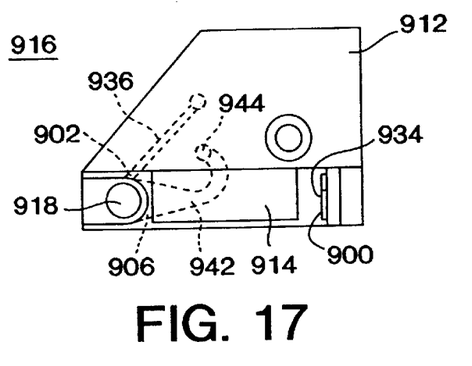
FIGS. 17–19 are various views of the nozzle assembly with internal fluid conduits shown in phantom.
Figure 19:
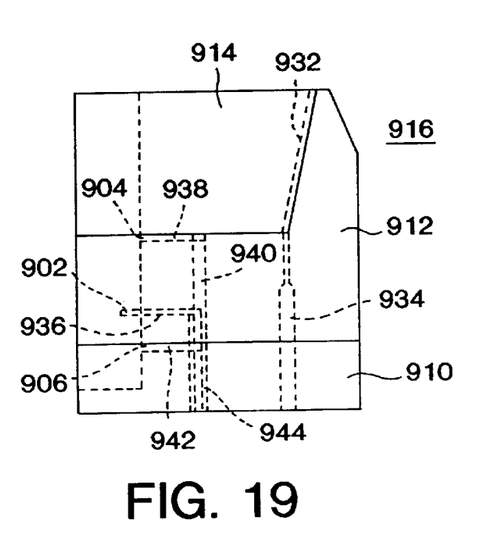

Workpiece rinse outlet 900 is in fluid communication with fluid path 920 via, e.g., a conduit 934 formed through lower and intermediate block assemblies 910, 912 (see FIGS. 16, 17, and 19). As illustrated in FIG. 19, conduit 934 preferably communicates with channel 932. Conduit 934 may be configured with a neck region to thereby alter the fluid flow characteristics of the rinse water.

In the preferred embodiment, workpiece rinse outlet 900 is configured such that the deionized water ejected therefrom does not intersect the interrogation signal transmitted by probe 316. In particular, workpiece rinse outlet 900 is oriented to direct the stream of deionized water in a substantially parallel direction relative to the transmit axis associated with probe 316, e.g., perpendicular to surface 304 of workpiece 306. This preferred orientation ensures that the interrogation and reflected signals associated with the workpiece monitoring procedure are not interrupted, obscured, deflected, or otherwise corrupted by the workpiece rinse fluid. The relative placement of workpiece rinse outlet 900 and probe 316 is such that region 314 is rinsed immediately before carrier element 124 rotates workpiece 306 to bring region 314 into position for interrogation by probe 316.

Probe rinse outlet 902 is located and configured to direct deionized water from a second source (not shown) to a location proximate probe tip 317 during processing of workpiece 306 to thereby clean probe tip 317 during an inactive period of the workpiece monitoring procedure. It is desirable to clean probe tip 317 during such inactive periods because the rinse water may otherwise affect the characteristics of the interrogation or reflected signals. Probe rinse outlet 902 is preferably configured to apply a substantially steady stream of deionized water to remove excess slurry and other extraneous material from probe tip 317. In the preferred embodiment, probe rinse outlet 902 is formed as a slit within intermediate block assembly 914. As with workpiece rinse outlet 900, the present invention may utilize a separate fluid jet or nozzle element coupled to nozzle assembly 916 rather than an integrally formed probe rinse outlet 902.

Figure 18:
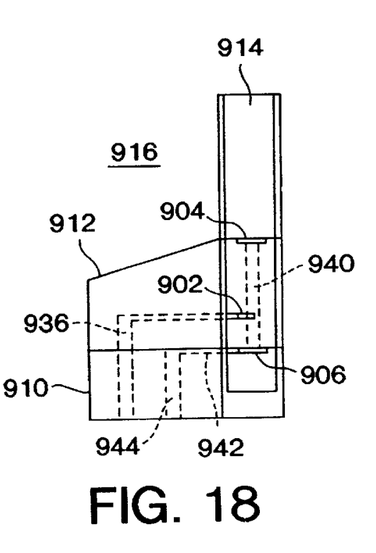

Probe rinse outlet 902 is in fluid communication with fluid path 922 via, e.g., a conduit 936 formed through lower and intermediate block assemblies 910 and 912 (see FIGS. 17–19). In the exemplary embodiment depicted herein, conduit 936 includes a vertical portion that is substantially aligned with fluid path 922 and a horizontal portion that communicates with the vertical portion. The vertical portion is preferably formed within lower and intermediate block assemblies 910 and 912, while the horizontal portion is preferably formed within intermediate block assembly 912. The specific location of conduit 936 may be altered to suit the particular application or to ensure that the various conduits and fluid paths are adequately separated within fixture 310.

Debris deflector outlet 904 may be located and configured to direct nitrogen gas (or any suitable fluid) proximate probe tip 317 during the workpiece monitoring procedure. Although not shown, compressed nitrogen gas is supplied by a source that may be controlled by controller/processor 326. Debris deflector outlet 904 is preferably oriented such that the emitted stream of nitrogen gas substantially prevents extraneous material (such as water or slurry) from contacting probe tip 317 while probe 316 transmits and receives signals. In the preferred embodiment, debris deflector outlet 904 is formed between intermediate block assembly 912 and upper block assembly 914. As best shown in FIG. 16, debris deflector outlet 904 may be realized by a channel 938 formed within intermediate block assembly 912.

Debris deflector outlet 904 and channel 938 are in fluid communication with fluid path 924 via, e.g., a conduit 940 formed through lower and intermediate block assemblies 910 and 912. The upper end of conduit 940 preferably terminates at channel 938 (proximate the junction of intermediate and upper block assemblies 912 and 914). As depicted in FIG. 18, conduit 940 preferably communicates with debris deflector outlet 904 and probe drying outlet 906 (described further below).

In the preferred embodiment, debris deflector outlet 904 is configured such that the compressed nitrogen gas emitted therefrom intersects the transmit axis associated with probe 316. Although the specific direction of the nitrogen gas stream may vary from application to application, an exemplary debris deflector outlet 904 is oriented such that the nitrogen gas stream intersects the transmit axis at a substantially orthogonal angle. This preferred orientation ensures that extraneous debris is deflected away from probe tip 317 in an effective manner.

Probe drying outlet 906 is positioned and configured to apply a stream of nitrogen gas (or other suitable fluid) toward probe tip 317 to thereby substantially remove excess water, debris, or other extraneous material from probe tip 317. Although not a requirement of the present invention, the nitrogen gas delivered to probe drying outlet 906 originates from the same source as the nitrogen gas emitted from debris deflector outlet 904. Accordingly, probe drying outlet 906 is also in fluid communication with fluid path 924 via, e.g., conduit 944. To ensure that probe tip 317 remains sufficiently dry and free from debris during the workpiece monitoring procedure, the nitrogen gas emitted from probe drying outlet 906 preferably stays active during the workpiece monitoring procedure.

In the exemplary embodiment depicted in FIGS. 9–14, probe drying outlet 906 is formed between lower block assembly 910 and intermediate block assembly 912. In particular, lower block assembly 910 preferably includes an integral channel 942 that communicates with conduit 944 and is shaped to route the nitrogen gas to probe drying outlet 906. In the exemplary embodiment shown herein, channel 942 also serves to connect conduit 944 with conduit 940 such that the nitrogen gas is also provided to debris deflector outlet 904.

Those skilled in the art should appreciate that the various fluid flow rates, pressures, and/or activation periods may be regulated by any suitable controller, e.g., controller/processor 326 or the processing/control circuits employed by CMP system 100 for other operations and procedures. Furthermore, the individual liquid or gas pressures and flow rates may be adjusted to suit the particular application and/or the type of workpieces being treated.

In accordance with an exemplary embodiment of the present invention, deionized water is supplied to workpiece rinse outlet 900 via fluid path 920 at a pressure in the range of 10 to 30 PSI and preferably at about 20 PSI; deionized water is supplied to probe rinse outlet 902 via fluid path 922 at a pressure in the range of 5 to 30 PSI and preferably at about 15 PSI; and nitrogen gas is supplied to debris deflector outlet 904 and to probe drying outlet 906 via fluid path 924 at a pressure in the range of 5 to 25 PSI and preferably at about 15 PSI.

The various fluids may be emitted from nozzle assembly 916 at predetermined times during processing of workpiece 306. An exemplary workpiece processing scheme may involve dispensing deionized water from probe rinse outlet 902 onto probe tip 317 during an inactive period of the workpiece monitoring procedure. For example, when workpiece 306 is being planarized, the monitoring procedure may include any number of endpoint detection techniques. Accordingly, CMP machine 100 may initiate cleaning of probe tip 317 upon activation of the endpoint detection system or during an initialization period associated with the planarization process.

The dispensing of the probe tip rinse water is preferably disabled at a predetermined time prior to activation of the endpoint detection procedure (or, alternately, after a predetermined time following activation of the probe rinse cycle). After disabling the probe tip rinse, nitrogen gas is applied through debris deflector outlet 904 and probe drying outlet 906. As described above, the nitrogen gas streams function to substantially prevent extraneous material from contacting probe tip 317 during the endpoint detection cycle and to remove water and debris from probe tip 317. After the nitrogen gas is activated, surface 304 of workpiece 306 is monitored with probe 316 during the endpoint detection procedure.

During the endpoint detection procedure, deionized water is applied to surface 304 through workpiece rinse outlet 900 in response to detection of the presence of workpiece 306 by the endpoint detection system. As described above, workpiece 306 extends beyond the outer edge 137 of table 120 (see FIGS. 2 and 9) periodically during the planarization or polishing process; probe 316 interrogates surface 304 during such "overhanging" periods. Thus, the workpiece rinse water is applied to workpiece 306 when the endpoint detection system detects the presence of workpiece 306 beyond the outer edge 137 of table 120.

In the preferred embodiment, the workpiece rinse water is only applied to workpiece 306 for a predetermined time, e.g., one to two seconds. Accordingly, application of the deionized water via workpiece rinse outlet 900 is disabled after a given time period. The relatively short duration of the workpiece rinse cycle ensures that excess rinse water does not accumulate on surface 304 prior to interrogation by probe 316.

The processing of workpiece 306 preferably continues while the endpoint detection system monitors for a predetermined characteristic of surface 304 to be reached. For example, as described above, the endpoint detection system may analyze the reflected optical signal to determine when an appropriate amount of material has been removed from workpiece 306. When a suitable endpoint has been reached, the probe tip rinse cycle (described above) is reactivated to clean probe tip 317 for the next endpoint detection procedure. Those skilled in the art will appreciate that the activation and deactivation of the various fluids, the processing of workpiece 306, and the monitoring of surface 304 may repeat or continue as necessary for additional workpieces.

In summary, the present invention provides improved methods and apparatus for detecting the endpoint of a planarization procedure performed upon a workpiece. The present invention also provides methods and in the workpiece surface and an optical endpoint detection probe during a planarization procedure performed upon the workpiece. The cleaning assembly may employ water to clean the surface of the workpiece to provide a suitable area for optical interrogation during the endpoint detection process. In addition, the cleaning assembly may employ compressed gas to clean the endpoint detection probe to facilitate substantially consistent signal generation and detection during the endpoint detection process. In accordance with one aspect of the present invention, the cleaning assembly applies water and nitrogen gas to clean the workpiece and the endpoint detection probe in a controlled mainner in accordance with the operating protocol of the corresponding endpoint detection process.

Although the subject invention is described herein in conjunction with the appended drawing figures, it will be appreciated that the invention is not limited to the specific form shown. It should be noted that several descriptive terms such as "first," "second," "upper," and "lower" are utilized herein for the sake of clarity and are not intended to restrict the interpretation of the present invention in any way. In addition, various modifications in the selection and arrangement of parts, components, and processing steps may be made in the implementation of the invention. For example, the present invention may utilize any number of suitable fluids other than, or in addition to, deionized water and nitrogen gas. These and other modifications may be made in the design and arrangement of the various components which implement the invention without departing from the spirit and scope of the invention as set forth in the appended claims.

What is claimed is:

1. An apparatus for cleaning a surface of a workpiece during processing of said workpiece, said apparatus comprising:

a support block having first and second fluid paths formed therein;

an interrogation probe coupled to said support block, said interrogation probe having a probe tip and being configured to transmit a signal through said probe tip, said signal being configured to interrogate said surface during a workpiece monitoring procedure;

means for directing a first fluid proximate said probe tip during processing of said workpiece, said means for directing being in fluid communication with said first fluid path; and means for applying a second fluid to said surface during said workpiece monitoring procedure, said means for applying being in fluid communication with said second fluid path.

2. An apparatus according to claim 1, wherein said means for directing is oriented such that said first fluid substantially prevents extraneus material from contacting said probe tip.

3. An apparatus according to claim 1, wherein said first fluid comprises a gas.

4. An apparatus according to claim 1, wherein said second fluid comprises liquid.

5. An apparatus for use with an interrogation probe utilized during a workpiece monitoring procedure, said apparatus comprising:

an interrogation probe having a probe tip and being capable of transmitting a signal through said probe tip and along an axis, said signal being configured to interrogate a surface of a workpiece, a support block having a cavity formed therein, said cavity being configured to receive and orient said interrogation probe;

means for directing a first fluid proximate said probe tip during processing of said workpiece, said means for directing being oriented such that said first fluid intersects said axis; and means for dispensing a second fluid onto said probe tip to thereby clean said probe tip during an inactive period of said workpiece monitoring procedure.

6. An apparatus according to claim 5, wherein said means for directing is oriented such that said first fluid intersects said axis at a substantially orthogonal angle.

7. An apparatus according to claim 5, wherein said axis forms an angle between 45 and 90 degrees relative to said surface.

8. An apparatus according to claim 5, wherein said first fluid comprises a gas, said second fluid comprises a liquid, and said means for directing is configured such that said gas substantially removes said liquid from said probe tip.

9. A nozzle assembly for distributing cleaning fluids to a surface of a workpiece and to an interrogation probe associated with a workpiece monitoring procedure, said nozzle assembly comprising:

a guide for a probe tip associated with said interrogation probe, said guide being configured to orient the probe tip such that a signal transmitted from said interrogation probe interrogates said workpiece surface during said workpiece monitoring procedure;

a plurality of fluid outlets formed therein for distributing a plurality of fluids proximate said probe tip; and a workplace rinse outlet formed therein for applying a rinse fluid to said surface during said workpiece monitoring procedure.

10. An apparatus according to claim 9, wherein a number of said fluid outlets are connected by a common conduit formed within said apparatus.

11. An apparatus according to claim 9, further comprising first and second block assemblies, wherein one of said fluid outlets is formed between said first and second block assemblies.

12. An apparatus according to claim 11, wherein one of said fluid outlets is formed within said second block assembly.

13. An apparatus according to claim 11, further comprising a third block assembly, wherein one of said fluid outlets is formed between said second and third block assemblies.

14. An apparatus according to claim 11, wherein said workpiece rinse outlet is formed between said second and third block assemblies.

15. An apparatus for cleaning a surface of a workpiece during processing of said workpiece, said apparatus comprising:

a support block having first and second fluid paths formed therein;

means for coupling an interrogation probe to said support block, said interrogation probe having a probe tip and being configured to transmit a signal through said probe tip, said signal being configured to interrogate said surface during a workpiece monitoring procedure;

means for directing a first fluid proximate said probe tip during processing of said workpiece, said means for directing being in fluid communication with said first fluid path; and means for applying second fluid to said surface during said workpiece monitoring procedure, said means for applying comprising a nozzle assembly coupled to said support block, said nozzle assembly having a fluid outlet formed therein, and said fluid outlet being in fluid communication with said second fluid path.

16. An apparatus for cleaning a surface of a workpiece during processing of said workpiece, said apparatus comprising:

a support block having first and second fluid paths formed therein;

means for coupling an interrogation probe to said support block, said interrogation probe having a probe tip and being configured to transmit a signal through said probe tip, said signal being configured to interrogate said surface during a workpiece monitoring procedure;

means for directing a first fluid proximate said probe tip during processing of said workpiece, comprising nozzle assembly coupled to said support block, said nozzle assembly having a fluid outlet formed therein, said fluid outlet being in fluid communication with said first fluid path; and means for applying second fluid to said surface during said workpiece monitoring procedure, said means for applying being in fluid communication with said second fluid path.

17. An apparatus according to claim 16, wherein:

said nozzle assembly comprises a first block assembly and a second block assembly coupled to said first block assembly; and said fluid outlet is formed between said first and second block assemblies.

18. An apparatus for cleaning a surface of a workpiece during processing of said workpiece, said apparatus comprising:

a support block having first and second fluid paths formed therein;

means for coupling an interrogation probe to said support block, said interrogation probe having a probe tip and being configured to transmit a signal through said probe tip, said signal being configured to interrogate said surface during a workpiece monitoring procedure;

means for directing a first fluid proximate said probe tip during processing of said workpiece, said means for directing being in fluid communication with said first fluid path;

means for applying second fluid to said surface during said workpiece monitoring procedure, said means for applying being in fluid communication with said second fluid path; and means for dispensing a third fluid onto said probe tip to thereby clean said probe tip during an inactive period of said workpiece monitory procedure.

19. An apparatus for use with an interrogation probe utilized during a workpiece monitoring procedure, said apparatus comprising:

an interrogation probe having a probe tip and being capable of transmitting a signal through said probe tip and along an axis, said signal being configured to interrogate a surface of a workpiece, a support block having a cavity formed therein, said cavity being configured to receive and orient said interrogation probe;

means for directing a first fluid proximate said probe tip during processing of said workpiece, said means for directing being oriented such that said first fluid intersects said axis;

means for dispensing a second fluid onto said probe tip to thereby clean said probe tip during an inactive period of said workpiece monitoring procedure; and means for applying a third fluid to said surface during said workpiece monitoring procedure, said means for applying being oriented such that said third fluid does not intersect said signal.

20. An apparatus according to claim 19, wherein said means for applying is oriented such that said third fluid travels in a substantially parallel direction relative to said axis.

* * * * *